United States Patent
Kim

(10) Patent No.: US 11,094,904 B2
(45) Date of Patent: Aug. 17, 2021

(54) LIGHT EMITTING DISPLAY APPARATUS FOR IMPROVING LIGHT EXTRACTING EFFICIENCY

(71) Applicant: LG DISPLAY CO., LTD., Seoul (KR)

(72) Inventor: NamSu Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 219 days.

(21) Appl. No.: 16/390,773

(22) Filed: Apr. 22, 2019

(65) Prior Publication Data

US 2019/0348624 A1 Nov. 14, 2019

(30) Foreign Application Priority Data

May 8, 2018 (KR) ........................ 10-2018-0052569

(51) Int. Cl.
*H01L 29/08* (2006.01)
*H01L 51/50* (2006.01)
*H01L 27/32* (2006.01)

(52) U.S. Cl.
CPC ...... *H01L 51/5012* (2013.01); *H01L 27/3246* (2013.01); *H01L 27/3276* (2013.01)

(58) Field of Classification Search
CPC ............. H01L 51/5012; H01L 27/3276; H01L 27/3246; H01L 2251/5315; H01L 51/5271; H01L 51/5268; H01L 51/5209; H01L 51/5225; H01L 27/3258; H01L 27/156; H01L 29/08
See application file for complete search history.

(56) References Cited

U.S. PATENT DOCUMENTS

| 9,653,652 | B2 * | 5/2017 | Shin | H01L 27/1262 |
| 9,660,217 | B2 * | 5/2017 | Fukuda | H01L 51/5268 |
| 10,347,871 | B2 * | 7/2019 | Joung | H01L 51/5221 |
| 10,804,484 | B2 * | 10/2020 | Kim | H01L 51/5268 |
| 2011/0175102 | A1 * | 7/2011 | Hatano | H01L 51/5243 |
| | | | | 257/72 |
| 2014/0103314 | A1 * | 4/2014 | Satoh | H01L 51/5268 |
| | | | | 257/40 |
| 2014/0138642 | A1 * | 5/2014 | Kim | H01L 51/5209 |
| | | | | 257/40 |
| 2014/0175420 | A1 * | 6/2014 | Pan | H01L 51/0043 |
| | | | | 257/40 |
| 2015/0179977 | A1 * | 6/2015 | Inada | H01L 51/5271 |
| | | | | 257/40 |
| 2015/0263235 | A1 * | 9/2015 | Shin | H01L 27/3258 |
| | | | | 257/72 |

(Continued)

FOREIGN PATENT DOCUMENTS

KR   10-2008-0061924 A   7/2008

*Primary Examiner* — Caleb E Henry
(74) *Attorney, Agent, or Firm* — Birch, Stewart, Kolasch & Birch, LLP

(57) ABSTRACT

A light emitting display apparatus includes a substrate, a first planarization layer on the substrate, a metal layer having an uneven surface and disposed on the first planarization layer, a second planarization layer covering the metal layer on the first planarization layer, and a light emitting element on the second planarization layer, wherein the second planarization layer is disposed between a bottom layer of the light emitting element and the metal layer so as to separate the bottom layer of the light emitting element from the metal layer.

24 Claims, 9 Drawing Sheets

(56) References Cited

U.S. PATENT DOCUMENTS

| | | | |
|---|---|---|---|
| 2015/0270512 A1* | 9/2015 | Yamae | H01L 51/5262 |
| | | | 257/40 |
| 2015/0303242 A1* | 10/2015 | Dai | H01L 51/5215 |
| | | | 257/40 |
| 2015/0303405 A1* | 10/2015 | Okumura | H01L 51/5203 |
| | | | 257/40 |
| 2016/0155784 A1* | 6/2016 | Park | H01L 27/3246 |
| | | | 257/88 |
| 2017/0324063 A1* | 11/2017 | Ohara | H01L 27/3213 |
| 2018/0211979 A1* | 7/2018 | Lee | H01L 51/5209 |
| 2020/0075699 A1* | 3/2020 | Kim | H01L 27/3246 |

* cited by examiner

LIGHT EMITTING DISPLAY APPARATUS FOR IMPROVING LIGHT EXTRACTING EFFICIENCY

CROSS-REFERENCE TO RELATED APPLICATIONS

This application claims the priority to Korean Patent Application No. 10-2018-0052569 filed on May 8, 2018, in the Korean Intellectual Property Office, the disclosure of which is incorporated herein by reference into the present application.

BACKGROUND

Field

The present disclosure relates to a light emitting display apparatus, and more particularly, to a light emitting display apparatus which has an improved light extracting efficiency and is capable of ensuring element stability.

Description of the Related Art

Currently, as the world enters a full-scale information era, a field of a display apparatus which visually expresses electrical information signals has been rapidly developed and studies are continuing to improve performances and properties of various display apparatuses such as thin-thickness, light weight, and low power consumption.

Among various display apparatuses, a light emitting display apparatus is a self-emitting display apparatus so that a separate light source is not necessary, which is different from the liquid crystal display apparatus. Therefore, the light emitting display apparatus may be manufactured to have light weight and small thickness. Further, since the light emitting display apparatus is driven at a low voltage, it is advantageous not only in terms of power consumption and but also in terms of color implementation, a response speed, a viewing angle, a contrast ratio (CR). Therefore, the light emitting display apparatuses are expected to be utilized in various fields.

Light emitted from a light emitting layer of the light emitting display apparatus passes through various components of the light emitting display apparatus to be output to the outside of the light emitting display apparatus. However, some of the light emitted from the light emitting layer may not be output to the outside of the light emitting display apparatus but may be confined inside the light emitting display apparatus so that the light extracting efficiency of the light emitting display apparatus becomes an issue.

For example, there is a limitation in that some light among the light emitted from the light emitting layer of the light emitting display apparatus according to the related art can be confined in the light emitting display apparatus due to a total reflection loss, a waveguide loss, and a surface plasmon loss. Here, the total reflection loss refers to degradation of light extracting efficiency due to the light confined in the light emitting display apparatus by the total reflection at an interface between a substrate and air, among the light emitted from the light emitting layer. The waveguide loss refers to the degradation of light extracting efficiency due to the light confined therein due to the total reflection at the interface of components in the light emitting display apparatus. The surface plasmon loss refers to a situation when the light vibrates free electrons of the metal surface due to a phenomenon that light is absorbed onto a metal surface during a process of entering and propagating the light so that the light cannot be reflected or transmitted, which in turn degrades the light extracting efficiency.

SUMMARY

The inventor of the present disclosure invented a light emitting display apparatus with a new structure which reduces the surface plasmon loss among various losses which degrade the light extracting efficiency.

Further, the inventor of the present disclosure found out that when a light emitting element is formed on an uneven surface, an anode, a light emitting layer, and a cathode are formed in accordance with a shape of the uneven surface. Further, the inventor of the present disclosure found out that when the light emitting element is formed on an uneven surface, the light emitting element may be formed to have an uneven shape and when configurations of the light emitting element are uneven, the reliability of the light emitting element may be degraded due to irregular electricity injection onto the uneven light emitting layer. Furthermore, the inventor of the present disclosure found out that when the light emitting layer is too thin or is disconnected during the process of forming the light emitting layer on an uneven surface, an anode and a cathode may be short-circuited and the corresponding pixel may become a dead pixel.

The inventor of the present disclosure found out that when the light emitting element is manufactured to be uneven, there is a problem in that scattering reflectance in an off-state of the light emitting display apparatus is increased so that a luminosity in an off-state, that is, a black luminosity may be degraded and thus not only the outdoor visibility, but also the contrast ratio can be degraded.

Therefore, the inventor of the present disclosure invented a light emitting display apparatus having a new structure which improves a reliability of an element and improves an outdoor visibility.

Further, the inventor of the present disclosure invented a new and improved light emitting display apparatus which addresses the above-identified and other limitations and disadvantages associated with the light emitting display apparatuses of the related art.

An object to be achieved by the present disclosure is to provide a light emitting display apparatus which can improve light extracting efficiency by minimizing surface plasmon loss.

Further, another object to be achieved by the present disclosure is to provide a light emitting display apparatus in which a metal layer serving as a reflective layer has a convex portion or a concave portion to improve the light extracting efficiency, but a planarization layer is added to allow a light emitting element to be formed on a planarized surface to improve not only the light extracting efficiency but also the stability of the light emitting element.

Further, another object to be achieved by the present disclosure is to provide a light emitting display apparatus which can improve an outdoor visibility and a contrast ratio.

Objects of the present disclosure are not limited to the above-mentioned objects, and other objects, which are not mentioned above, can be clearly understood by those skilled in the art from the following descriptions.

According to an aspect of the present disclosure, a light emitting display apparatus includes a substrate; a first planarization layer on the substrate; a metal layer having an uneven surface and disposed on the first planarization layer; a second planarization layer covering the metal layer on the first planarization layer; and a light emitting element on the second planarization layer. The second planarization layer can be disposed between a bottom layer of the light emitting element and the metal layer so as to separate the bottom layer of the light emitting element from the metal layer.

Therefore, the metal layer having an uneven shape is used so that efficiency of light extracted to the outside of the light emitting element is improved, thereby reducing the power consumption. Further, an additional planarization layer is disposed between the metal layer and the light emitting element so that electrical stability of the light emitting element can be ensured.

According to another aspect of the present disclosure, a light emitting display apparatus includes a substrate; a first planarization layer on the substrate; a light emitting element on the first planarization layer; a reflective layer between the first planarization layer and the light emitting element, the reflective layer having a plurality of convex portions and/or a plurality of concave portions to reflect light emitted from the light emitting element toward the light emitting element and configured to enhance an light extracting efficiency of the light emitting element; and a second planarization layer, which includes a flat upper surface, covers the reflective layer so as to reduce a scattering reflectance of the reflective layer and the light emitting element, and electrically insulates the light emitting element from the reflective layer. Therefore, not only the light extracting efficiency of the light emitting display apparatus is improved, but also the black luminosity of the light emitting display apparatus is improved so that the lowering of outside visibility and the lowering of contrast ratio can be improved.

According to another aspect of the present disclosure, a light emitting display apparatus includes a substrate; a first planarization layer on the substrate; a metal layer on the first planarization layer; a second planarization layer covering the metal layer on the first planarization layer; and a light emitting element on the second planarization layer, wherein the metal layer is formed to be conformal with the second planarization layer to reduce surface plasmon loss of the metal layer, thereby improving light extracting efficiency of the light emitting display apparatus.

Other detailed matters of the exemplary embodiments are included in the detailed description and the drawings.

According to the present disclosure, the surface plasmon loss by which the light is absorbed onto the light emitting layer and the metal surface of the light emitting display apparatus is addressed to improve the optical efficiency.

According to the present disclosure, a planarization layer is disposed on a metal layer having an uneven structure in the light emitting display apparatus to improve the efficiency of the light which is extracted to the outside of the light emitting element. Therefore, the power consumption can be reduced and the electrical stability of the light emitting element can be ensured/improved.

According to the present disclosure, the black luminosity is improved so that the outdoor visibility degradation and the contrast ratio degradation can also be improved effectively.

The effects and advantages according to the present disclosure are not limited to the contents exemplified above and below, and additional various effects and advantages are obtained by the light emitting display apparatuses according to the embodiments of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
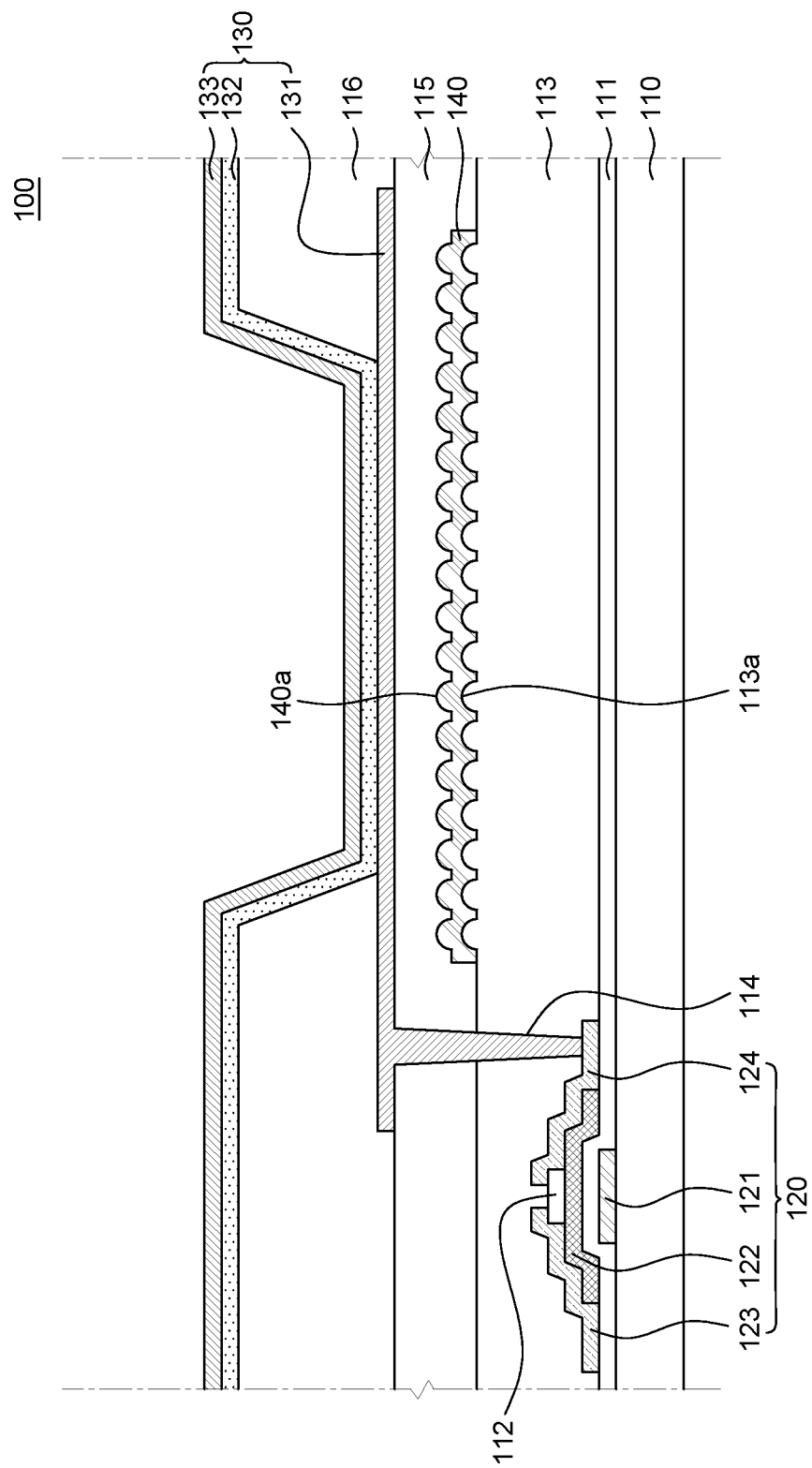
FIG. 1 is a cross-sectional view of a light emitting display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer (or layers) or another element (or elements) may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a cross-sectional view of a light emitting display apparatus according to an exemplary embodiment of the present disclosure. All the components of the light emitting display apparatus according to all embodiments of the present disclosure are operatively coupled and configured.

Referring to FIG. 1, a light emitting display apparatus 100 according to an exemplary embodiment of the present disclosure includes a substrate 110, a gate insulating layer 111, a thin film transistor 120, a first planarization layer 113, a metal layer 140, a second planarization layer 115, and a light emitting element 130. The light emitting element 130 includes an anode 131, a light emitting layer 132 disposed on the anode 131, and a cathode 133 disposed on the light emitting layer 132.

The substrate 110 is a substrate which supports and protects several components of the light emitting display apparatus 100. The substrate 110 can be formed of a glass or a plastic material having flexibility. When the substrate 110 is formed of a plastic material, for example, the substrate 100 can be formed of polyimide (PI). But it is not limited thereto.

With reference to FIG. 1, the thin film transistor 120 is disposed on the substrate 110. The thin film transistor 120 can be used as a driving element of the display apparatus. The thin film transistor 120 includes a gate electrode 121, an active layer 122, a source electrode 123, and a drain electrode 124. In the light emitting display apparatus 100 according to the exemplary embodiment of the present disclosure, the thin film transistor 120 has a structure in which the active layer 122 is disposed on the gate electrode 121, and the source electrode 123 and the drain electrode 124 are disposed on the active layer 122. Therefore, the thin film transistor 120 has a bottom gate structure in which the gate electrode 121 is disposed in the lowermost portion, but is not limited thereto.

With reference to FIG. 1, the gate electrode 121 of the thin film transistor 120 is disposed on the substrate 110. The gate electrode 121 can be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof.

With reference to FIG. 1, the gate insulating layer 111 is disposed on the gate electrode 121. The gate insulating layer 111 is a layer for electrically insulating the gate electrode 121 from the active layer 122 and can be formed of an insulating material. For example, the gate insulating layer 111 can be formed as a single layer of silicon nitride (SiNx) or silicon oxide (SiOx) which is an inorganic material or a multiple layer of silicon nitride (SiNx) or silicon oxide (SiOx).

With reference to FIG. 1, the active layer 122 is disposed on the gate insulating layer 111. The active layer 122 is disposed so as to overlap the gate electrode 121. For example, the active layer can be formed of an oxide semiconductor or amorphous silicon (a-Si), polycrystalline silicon (poly-Si), or an organic semiconductor.

With reference to FIG. 1, an etch stopper 112 is disposed on the active layer 122. The etch stopper 112 is a layer formed to prevent the damage of the surface of the active layer 122 due to the plasma when the source electrode 123 and the drain electrode 124 are patterned using an etching method. One end of the etch stopper 112 overlaps the source electrode 123 and the other end of the etch stopper 112 overlaps the drain electrode 124.

With reference to FIG. 1, the source electrode 123 and the drain electrode 124 are disposed on the active layer 122 and the etch stopper 112. The source electrode 123 and the drain electrode 124 are disposed on the same layer and are spaced apart from each other. The source electrode 123 and the drain electrode 124 can be electrically connected to the active layer 122 to be in contact with the active layer 122. The source electrode 123 and the drain electrode 124 can be composed of any one or more of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof.

With reference to FIG. 1, the first planarization layer 113 is disposed on the thin film transistor 120. The first planarization layer 113 is an insulating layer which protects the thin film transistor 120 and defines a step or hole on the substrate 110, where a portion of the first planarization layer 113 directly above and covering the thin film transistor 120 has a planarized top surface. The first planarization layer 113 can be formed of one or more of acrylic resin, epoxy resin, phenol resin, polyamide resin, polyimide resin, unsaturated polyester resin, polyphenylene resin, polyphenylene sulfide resin, benzocyclobutene, and photoresist, but is not limited thereto.

With reference to FIG. 1, the first planarization layer 113 includes a plurality of convex portions 113a. The convex portions 113a of the first planarization layer 113 can be formed by a mask process, but is not limited thereto.

As illustrated in FIG. 1, the plurality of convex portions 113a of the first planarization layer 113 are formed in an area corresponding to a position where the light emitting element 130 is formed. For example, the convex portions 113a are located only below an area where the anode 131 contacts the light emitting layer 132. However, the convex portions 113a are not limited thereto and may be formed on an entire surface of the first planarization layer 113.

Even though in FIG. 1 it is illustrated that the first planarization layer 113 includes a plurality of convex portions, the first planarization layer 113 can include a plurality of concave portions. For example, the first planarization layer 113 can have a plurality of convex portions (e.g., projections) and/or a plurality of concave portions (e.g., indents). Preferably, these convex and/or concave portions can be periodically repeated or uniformly dispersed. Further, even though in FIG. 1 it is illustrated that the plurality of convex portions of the first planarization layer 113 have a hemispherical shape, the plurality of convex portions can have a semi-ellipsoidal shape, a pyramidal shape or other various shapes.

With reference to FIG. 1, the metal layer 140 having an uneven shape is disposed on the first planarization layer 113. For example, since the metal layer 140 is formed along upper surfaces of the plurality of convex portions 113a, the metal layer 140 can have an uneven shape (e.g., convex portions 140a) corresponding to the shape of the plurality of convex portions 113a. For example, certain top surfaces of both the first planarization layer 113 and the metal layer 140 can have the same or similar shapes/configurations. Therefore, the surface plasmon loss is improved so that the light extracting efficiency can be improved.

Further, the metal layer 140 can also serve as a reflective layer which reflects light emitted from the light emitting layer 132 toward the cathode 133. Therefore, the metal layer 140 is formed in an area corresponding to the light emitting element 130 so as to be located between the first planarization layer 113 and the light emitting element 130. The metal layer 140 serves as a reflective layer so that the metal layer 140 can be formed of a reflective material and for example, formed of aluminum (Al) or silver (Ag).

With reference to FIG. 1, a second planarization layer 115 is disposed on the first planarization layer 113 and the metal layer 140. The second planarization layer 115 is an insulating layer which planarizes a surface on which the light emitting element 130 is formed. For example, even though the metal layer 140 disposed below the second planarization layer 115 has an uneven shape (e.g., projections and/or indents disposed at its top surface), the second planarization layer 115 is disposed so that the light emitting element 130 can be disposed on an even surface of the second planarization layer 115.

The second planarization layer 115 can be formed of a transparent organic material. For example, the second planarization layer 115 can be formed of a material which does not outgas during the process of manufacturing the light emitting element 130 or after manufacturing the light emitting element 130. For example, the second planarization layer 115 is preferably formed of a transparent organic material which does not outgas so that the light reflected during the vapor deposition passes therethrough.

For example, the second planarization layer 115 can be formed of one or more of acrylic resin, epoxy resin, phenol resin, polyamide resin, polyimide resin, unsaturated polyester resin, polyphenylene resin, polyphenylene sulfide resin, benzocyclobutene, and photoresist, but is not limited thereto. Further, the second planarization layer 115 can be formed of the same or similar material as the first planarization layer 113.

The second planarization layer 115 needs to cover the plurality of convex portions 140a of the metal layer 140 disposed therebelow so that the second planarization layer 115 can be formed to be thicker than a height of the plurality of convex portions 140a. Therefore, the thickness of the second planarization layer 115 can be high enough to planarize the metal layer 140 having the plurality of convex portions 140a. Only as an example, the thickness of the second planarization layer 115 can be 0.5 μm to 5 μm.

With reference to FIG. 1, the light emitting element 130 is disposed on the second planarization layer 115 to overlap the metal layer 140. The light emitting element 130 is disposed on the second planarization layer 115. The light emitting element 130 includes the anode 131 which is electrically connected to the drain electrode 124 of the thin film transistor 120 via contact holes 114 defined through the first and second planarization layers 113 and 115, the light emitting layer 132 disposed on the anode 131, and the cathode 133 formed on the light emitting layer 132.

The anode 131 is disposed on the second planarization layer 115 to be electrically connected to the drain electrode 124 through the contact holes 114 formed in the first planarization layer 113 and the second planarization layer 115. The anode 131 is electrically insulated from the metal layer 140 by the second planarization layer 115 and can be floated. The anode 131 can be formed of a conductive material having a high work function to supply holes to the light emitting layer 132. For example, the anode 131 can be formed of transparent conductive oxide such as indium tin oxide (ITO), indium zinc oxide (IZO), indium tin zinc oxide (ITZO), zinc oxide (ZnO), and tin oxide (TO).

The light emitting display apparatus 100 according to the exemplary embodiment of the present disclosure is a top emission type light emitting display apparatus 100. However, in the light emitting display apparatus 100 according to the exemplary embodiment of the present disclosure, the anode 131 does not include an additional reflective layer, but the metal layer 140 disposed between the first planarization layer 113 and the second planarization layer 115 functions to reflect light emitted from the light emitting layer 132 toward the cathode 133.

The light emitting layer 132 is a layer for emitting light having a specific color and includes at least one of a red light emitting layer, a green light emitting layer, a blue light emitting layer, and a white light emitting layer. Further, the light emitting layer 132 can further include various layers such as a hole transporting layer, a hole injecting layer, an electron injecting layer, or an electron transporting layer. The light emitting layer 132 can be an organic light emitting layer.

The cathode 133 is disposed on the light emitting layer 132. The cathode 133 supplies electrons to the light emitting layer 132. The cathode 133 can be formed of transparent conductive oxide such as indium tin oxide (ITO), indium zinc oxide (IZO), indium tin zinc oxide (ITZO), zinc oxide (ZnO), and tin oxide (TO) or ytterbium (Yb) alloy. Alternatively, the cathode 133 can be formed of a metal material such as silver (Ag), copper (Cu), or an alloy of magnesium and silver (Mg:Ag).

The light emitting display apparatus 100 according to the exemplary embodiment of the present disclosure is a top emission type light emitting display apparatus so that the light emitting display apparatus 100 can be manufactured so as to implement micro cavity. For example, in the light emitting display apparatus 100 according to the exemplary embodiment of the present disclosure, a distance between the metal layer 140 and the cathode 133 is set so that a constructive interference for light emitted from the light emitting layer 132 is implemented to improve luminous efficiency.

With reference to FIG. 1, a bank 116 can be disposed on the anode 131 and the second planarization layer 115. The bank 116 can cover some portion of the anode 131 of the light emitting element to define an emission area. The bank 116 can be formed of an organic material. For example, the bank 116 can be formed of polyimide, acrylic, or benzocyclobutene resin, but is not limited thereto.

Further, an encapsulating layer can be formed on the light emitting element 130 to protect the light emitting element 130 which is vulnerable to moisture, so as not to be exposed to the moisture. For example, the encapsulating layer can have a structure in which inorganic layers and organic layers are alternately laminated, but is not limited thereto.

In the light emitting display apparatus 100 according to the exemplary embodiment of the present disclosure, the plurality of convex portions 113*a* are formed at the first planarization layer 113 so that the metal layer 140 is also formed to have an uneven shape/configuration generally corresponding to the convex portions 113*a*. Therefore, the light extracting efficiency of the light emitting element 130 can be improved. For example, a convex-concave structure is implemented on a surface of the metal layer 140 which reflects the light emitted from the light emitting layer 132 toward the cathode 133 so that the vibration of free electrons of the surface of the metal layer 140 is suppressed or reduced. Therefore, the surface plasmon loss is improved and thus an amount of light extracted to the outside can be increased. Accordingly, the power consumption of the light emitting display apparatus 100 can be effectively reduced.

In the light emitting display apparatus 100 according to the exemplary embodiment of the present disclosure, the plurality of convex portions 113*a* of the first planarization layer 113 can be formed only in the pixel position so that a blurring phenomenon where the image is displayed to be indistinct due to the plurality of convex portions 113*a* can be suppressed or reduced. Further, since the plurality of convex portions 113*a* of the first planarization layer 113 are formed so as to correspond to only the pixel position, a process for forming a contact hole (e.g., 114) for the anode 131 in the first planarization layer 113 can be more easily performed.

Further, in the light emitting display apparatus 100 according to the exemplary embodiment of the present disclosure, as described above, the plurality of convex portions 113*a* can be formed on the entire surface of the first planarization layer 113. In this case, a separate mask process for partially forming the plurality of convex portions 113*a* is unnecessary so that a process cost and a process time can be saved/reduced.

In the light emitting display apparatus 100 according to the exemplary embodiment of the present disclosure, the micro cavity is implemented so that the light extracting efficiency can be improved by the constructive interference of light emitted from the light emitting layer 132. When the micro cavity is implemented, a problem in that the color sense difference is increased depending on a viewing angle may be caused. Therefore, in the light emitting display apparatus 100 according to the exemplary embodiment of the present disclosure, the metal layer 140 has an uneven shape so that the light reflected from the metal layer 140 is scattered. As a result, the color sense difference depending on the viewing angle can be advantageously reduced.

Further, in the light emitting display apparatus 100 according to the exemplary embodiment of the present disclosure, the second planarization layer 115 is disposed on the first planarization layer 113 and the metal layer 140 which have the uneven shapes, and the light emitting element 130 is formed on the second planarization layer 115. Therefore, the light emitting element 130 can be formed over the even surface so that the electricity injection characteristic of the light emitting element 130 can be uniformly implemented and the reliability of the light emitting element 130 can be improved. Further, since the light emitting element 130 is formed on the even surface, an electrical short between the anode 131 and the cathode 133 which may be generated when the light emitting layer 132 is formed to be too thin or cracked during the manufacturing process, can be prevented.

Further, in the light emitting display apparatus 100 according to the exemplary embodiment of the present disclosure, the second planarization layer 115 is disposed on the first planarization layer 113 and the metal layer 140 so that the scattering reflectance in the metal layer 140 can be reduced. For example, when the light emitting display apparatus 100 is in an off-state or displays a black image, if light is scattered too much from the metal layer 140 and the light emitting element 130, then the outdoor visibility can be lowered and the contrast ratio can be lowered. However, in the light emitting display apparatus 100 according to the exemplary embodiment of the present disclosure, the second planarization layer 115 is disposed between the metal layer 140 and the light emitting element 130. Therefore, the scattering reflectance in the light emitting element 130 is lowered such that the black luminosity is improved, thereby improving the outdoor visibility and the contrast ratio.

Hereinafter, an effect of improving the lowering of the outdoor visibility and the lowering of the contrast ratio in the light emitting display apparatus 100 according to the exemplary embodiment of the present disclosure and an effect for an element stability will be described in detail with reference to FIGS. 2 and 3.

Figure 2:
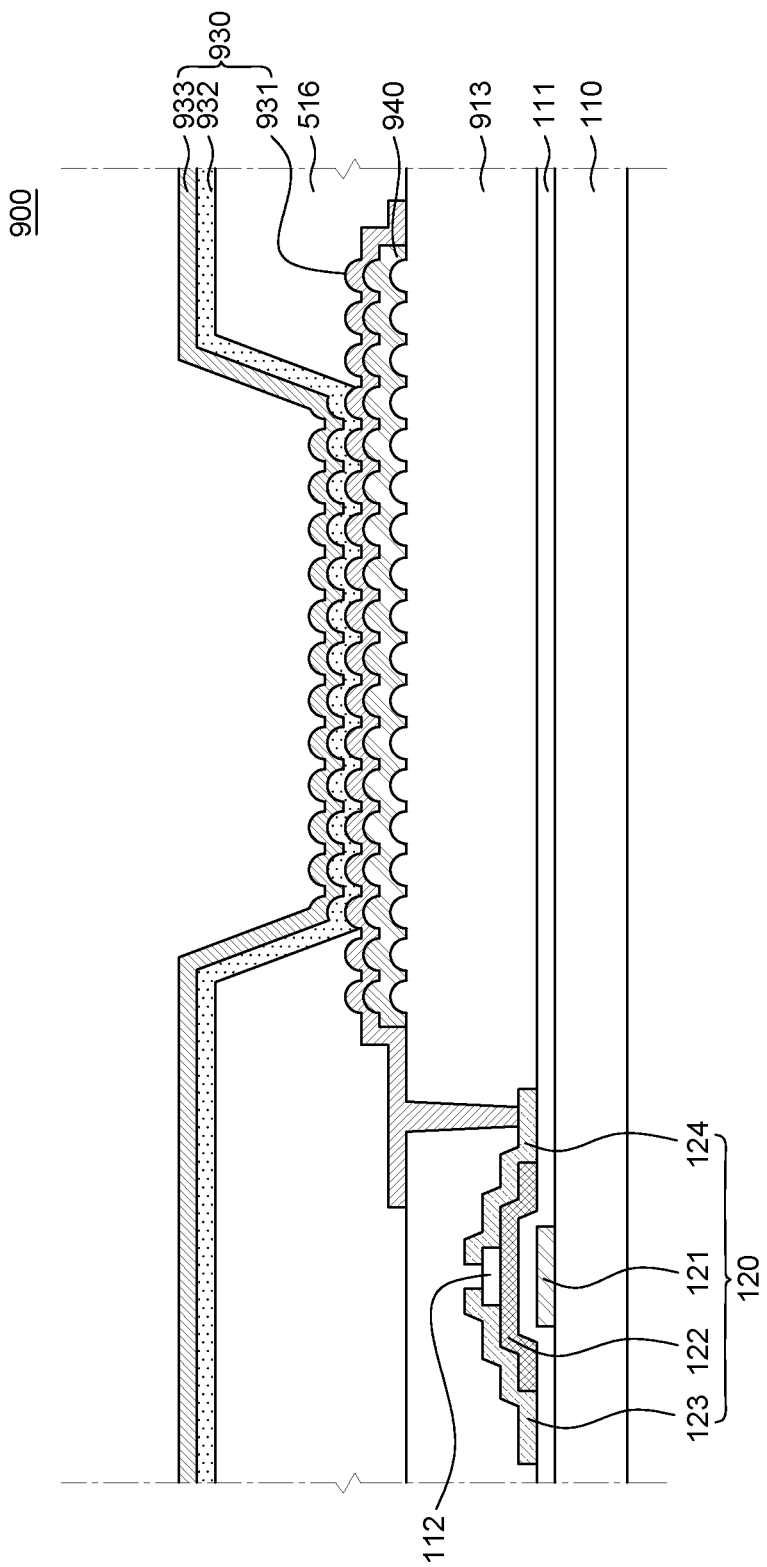
FIG. 2 is a cross-sectional view of a light emitting display apparatus according to a comparative example.

FIG. 2 is a cross-sectional view of a light emitting display apparatus 900 according to a comparative example. FIG. is a graph by measuring a scattering reflectance with respect to a wavelength of light of each of the light emitting display apparatus 100 of FIG. 1 and the light emitting display apparatus 900 in the comparative example of FIG. 2.

With reference to FIG. 2, the light emitting display apparatus 900 according to the comparative example is a light emitting display apparatus in which the second planarization layer 115 of the light emitting display apparatus 100 of FIG. 1 is not disposed, i.e., is omitted.

With reference to FIG. 2, the light emitting display apparatus 900 includes a thin film transistor 120 disposed on a substrate 110, and a gate insulating layer 111 disposed on the substrate 110. The thin film transistor 120 includes a gate electrode 121, an active layer 122, a source electrode 123, and a drain electrode 124. A planarization layer 913 is disposed on the gate insulating layer 111, and a metal layer 940 having an uneven shape is disposed on the first planarization layer 913 having an uneven shape. The metal layer 940 is formed of a conductive material and has a thickness of approximately 100 nm.

With reference to FIG. 2, in the light emitting display apparatus 900 according to the comparative example, a second planarization layer (e.g., layer 115 in FIG. 1) is not formed or is completely absent, so that a light emitting element 930 is formed immediately or directly on the metal layer 940 having an uneven shape. A bank 516 is disposed on an anode 931. Therefore, all the anode 931, a light emitting layer 932, and a cathode 933 disposed on the metal layer 940 are formed along an upper surface of a plurality of convex portions of the planarization layer 913 and have uneven shapes.

Therefore, in the light emitting display apparatus 900 according to the comparative example, the plurality of convex portions are formed on all the planarization layer 913, the metal layer 940, the anode 931, the light emitting layer 932, and the cathode 933. Therefore, the stability of the element can be lowered due to the irregular electricity injection characteristic in the entire area of the light emitting element 930.

In clear contrast, in the light emitting display apparatus 100 according to the exemplary embodiment of the present disclosure, the second planarization layer 115 is disposed on the first planarization layer 113 and the metal layer 140 so that the light emitting element 130 having an even structure is formed. Therefore, the stability of the element can be ensured and improved by the uniform electricity injection characteristic in the entire area of the light emitting element 130.

Further, in the light emitting display apparatus 900 according to the comparative example, the plurality of convex portions are formed in all the planarization layer 913, the metal layer 940, the anode 931, the light emitting layer 932, and the cathode 933. Therefore, during the process of forming the light emitting layer 932 on the curved anode 931, a specific area of the light emitting layer 932 is formed to be thin or disconnected so that there can be a problem in that the cathode 933 and the anode 931 are short-circuited or the shorted pixel becomes a dead pixel.

In clear contrast, in the light emitting display apparatus 100 according to the exemplary embodiment of the present disclosure, the second planarization layer 115 is disposed on the first planarization layer 113 and the metal layer 140 so that the light emitting element 130 having an even structure is formed. Therefore, the thickness of the light emitting layer 132 can be constantly maintained and a short-circuit of the anode 131 and the cathode 133 can be prevented.

Figure 3:
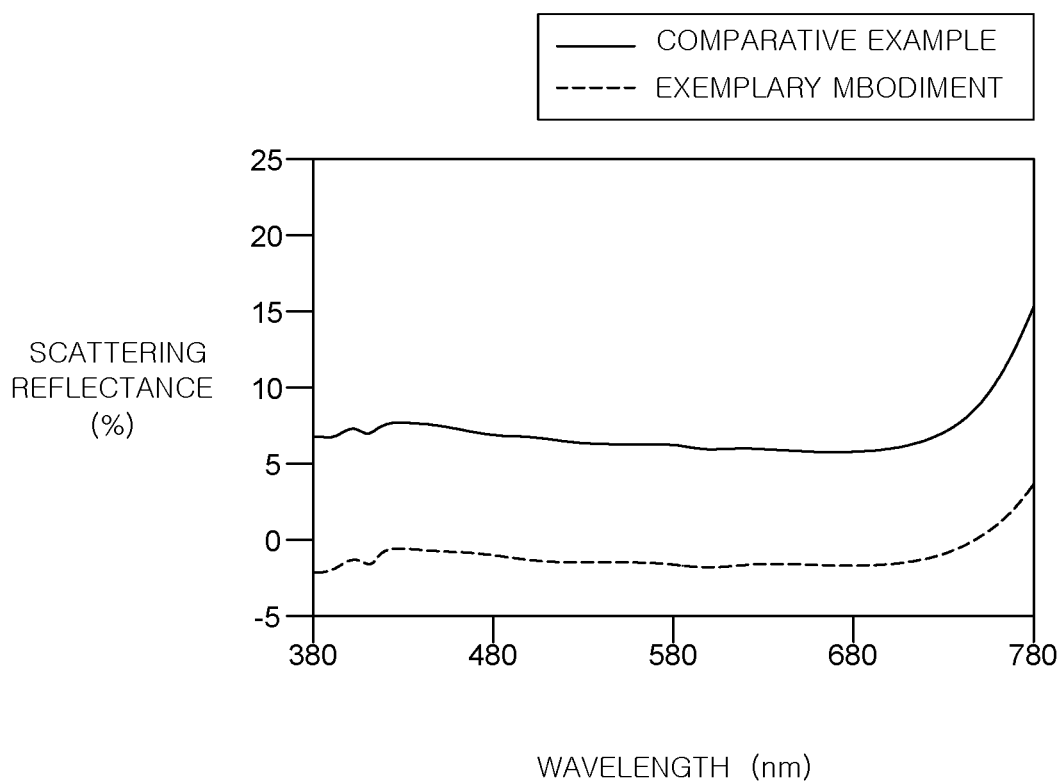
FIG. 3 is a graph obtained by measuring a scattering reflectance with respect to a wavelength of light of a light emitting display apparatus according to an exemplary embodiment of the present disclosure and a comparative example.

The graph illustrated in FIG. 3 is an example of a graph for a scattering reflectance measured after irradiating light having various wavelengths onto the light emitting display apparatuses 100 and 900 in a power-off state of the light emitting apparatus 100 according to the exemplary embodiment of the present disclosure and the light emitting display apparatus 900 according to the comparative example.

In FIG. 3, a horizontal axis denotes a wavelength of light and a vertical axis denotes a scattering reflectance of light in a corresponding wavelength range. In order to measure the graph illustrated in FIG. 3, a light with the wavelength of 380 nm to 780 nm is irradiated onto the light emitting apparatus 100 according to the exemplary embodiment of the present disclosure and the light emitting display apparatus 900 according to the comparative example, and light which is reflected or transmitted is measured using measurement equipment called Cary 5000.

With reference to FIG. 3, it shows that the scattering reflectance of the comparative example is significantly higher than the scattering reflectance of the exemplary embodiment. For example, in a wavelength range of 380 nm to 760 nm, the scattering reflectance of the comparative example is 6% to 10%, whereas in the wavelength range of 380 to 760 nm, the scattering reflectance of the exemplary embodiment is −1% to −3%. Therefore, it shows that the scattering reflectance of the comparative example is 7% to 13% higher than the scattering reflectance of the exemplary embodiment.

Therefore, in the light emitting display apparatus 900 according to the comparative example, the light emitting element 930 is formed to be curved so that the more the light emitting element has a bent shape or uneven shape, the more the light is scattered. Therefore, the scattering is generated more due to the external light even in an off-state, so that the screen of the light emitting display apparatus 900 is not seen to be black, but may be blurred. Therefore, in the comparative example in which the second planarization layer 115 of the exemplary embodiment of the present disclosure is completely absent, the black luminosity is lowered so that not only the outdoor visibility is significantly lowered, but also the contrast ratio is lowered in the comparative example.

In clear contrast, in the case of the light emitting element 130 according to the exemplary embodiment of the present disclosure, vastly different from the comparative example, the light emitting element 130 is evenly formed so that the scattering characteristic of external light in an off-state can be lowered. Therefore, the light emitting display apparatus 100 according to the exemplary embodiment of the present disclosure can improve the outdoor visibility and the contrast ratio.

When the reflectance of light is measured, generally, the reflectance is measured in a state when the measurement equipment is set such that a sum of reflectance, transmittance, and absorption in an object is 100%. However, an organic material which is applied to the light emitting element, for example, the organic light emitting layer has a self-emitting characteristic when light in a specific wavelength range is irradiated. Therefore, when the reflectance, the transmittance, and the absorption for a material which emits light are measured, a total can be 100% or higher. Therefore, in the experiment for the graph illustrated in FIG. 3, the measurement value is corrected such that the sum of the reflectance, the transmittance, and the absorption is 100%. For example, a ratio for light emitted from the organic light emitting layer is reduced. Accordingly, the scattering reflectance according to the exemplary embodiment described above is measured to have a negative (−) value.

Figure 4:
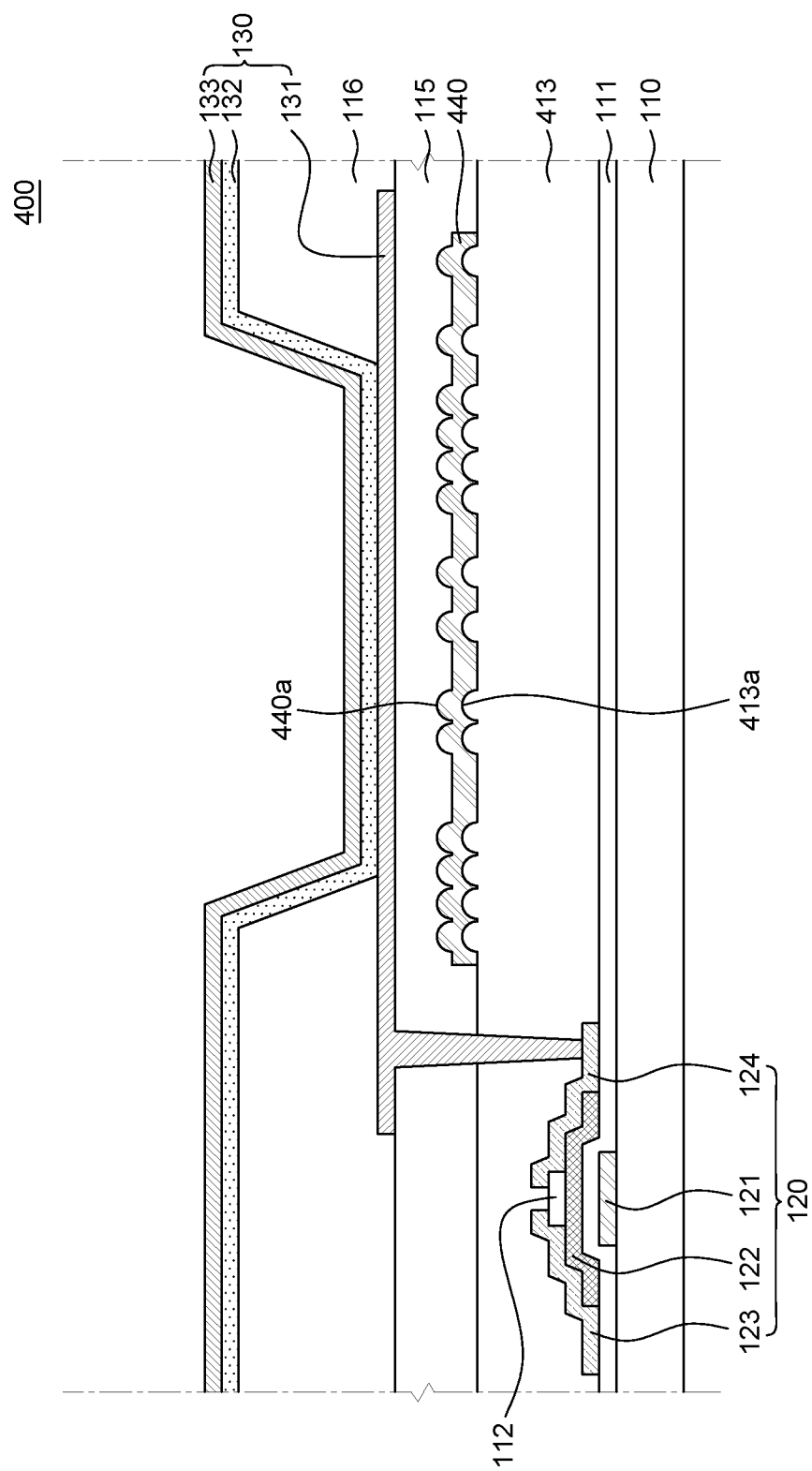
FIG. 4 is a cross-sectional view of a light emitting display apparatus according to another example embodiment of the present disclosure.

FIG. 4 is a cross-sectional view of a light emitting display apparatus according to another example embodiment of the present disclosure. As compared with the light emitting display apparatus 100 of FIG. 1, a first planarization layer 413 and a metal layer 440 of a light emitting display apparatus 400 of FIG. 4 are different but other configurations are the same or substantially the same so that a redundant description will be omitted or brief.

With reference to FIG. 4, the first planarization layer 413 includes a plurality of convex portions 413a which are aperiodically formed, e.g., non-uniformly dispersed. In other words, the pitches between the plurality of convex portions may be different from each other. For example, the plurality of convex portions 413a of the first planarization layer 413 do not have a regular pattern but a density of the plurality of convex portions 413a is high in some areas while a density of the plurality of convex portions 413a is low in the other areas. Further, distances between the plurality of convex portions can vary from each other.

With reference to FIG. 4, the metal layer 440 is formed along an upper surface of the first planarization layer 413 including the plurality of convex portions 413a which are aperiodically formed. Therefore, the metal layer 440 can have a plurality of aperiodic convex portions 440a corresponding to the plurality of convex portions 413a of the first planarization layer 413.

Therefore, in the light emitting display apparatus 400 according to this example embodiment of the present disclosure, the plurality of aperiodic convex portions 440a are formed on the metal layer 440 so that the surface plasmon loss by which the light is absorbed onto the metal surface is improved to enhance the luminous efficiency. Further, the efficiency of light extracted to the outside of the light emitting element 130 is improved to reduce the power consumption and ensure the electrical stability of the light emitting element 130. Furthermore, in the light emitting display apparatus 400 according to this example embodiment of the present disclosure, the scattering reflectance is minimized using the second planarization layer 115 to improve the scattering characteristic and improve the black luminosity. Therefore, the outdoor visibility and the contrast ratio can be improved.

In some certain circumstances, when the plurality of convex portions of the first planarization layer are periodically formed so that the metal layer also has a periodic convex-concave structure, constructive interference and destructive interference may possibly be generated along a traveling direction of light which is reflected or transmitted from the metal layer. As a result, a diffractive interference or moiré interference may possibly be generated. In this case, there may be a limitation in that the user may visibly recognize interference Mura such as a wave pattern.

Therefore, in the light emitting display apparatus 400 according to this example embodiment of the present disclosure, the plurality of convex portions 413a of the first planarization layer 413 are aperiodically disposed so that the metal layer 440 also has a plurality of irregular convex portions 440a. Accordingly, the light emitting display apparatus 400 according to this example embodiment of the present disclosure can address the limitation in that a user may visibly recognize the interference Mura due to the diffractive interference or moiré interference of light.

Figure 5A:
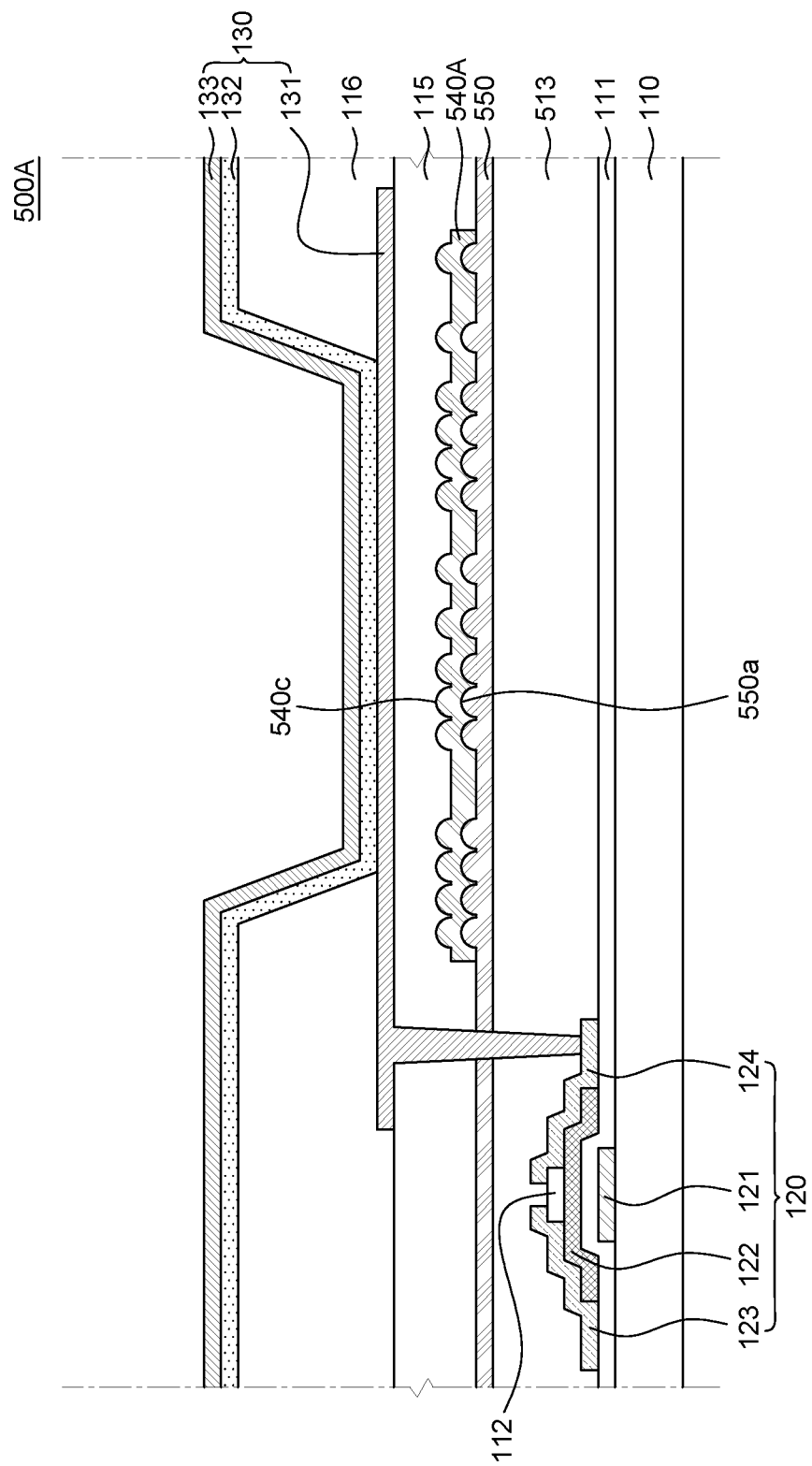
FIG. 5A is a cross-sectional view of a light emitting display apparatus according to another example embodiment of the present disclosure.
Figure 5B:
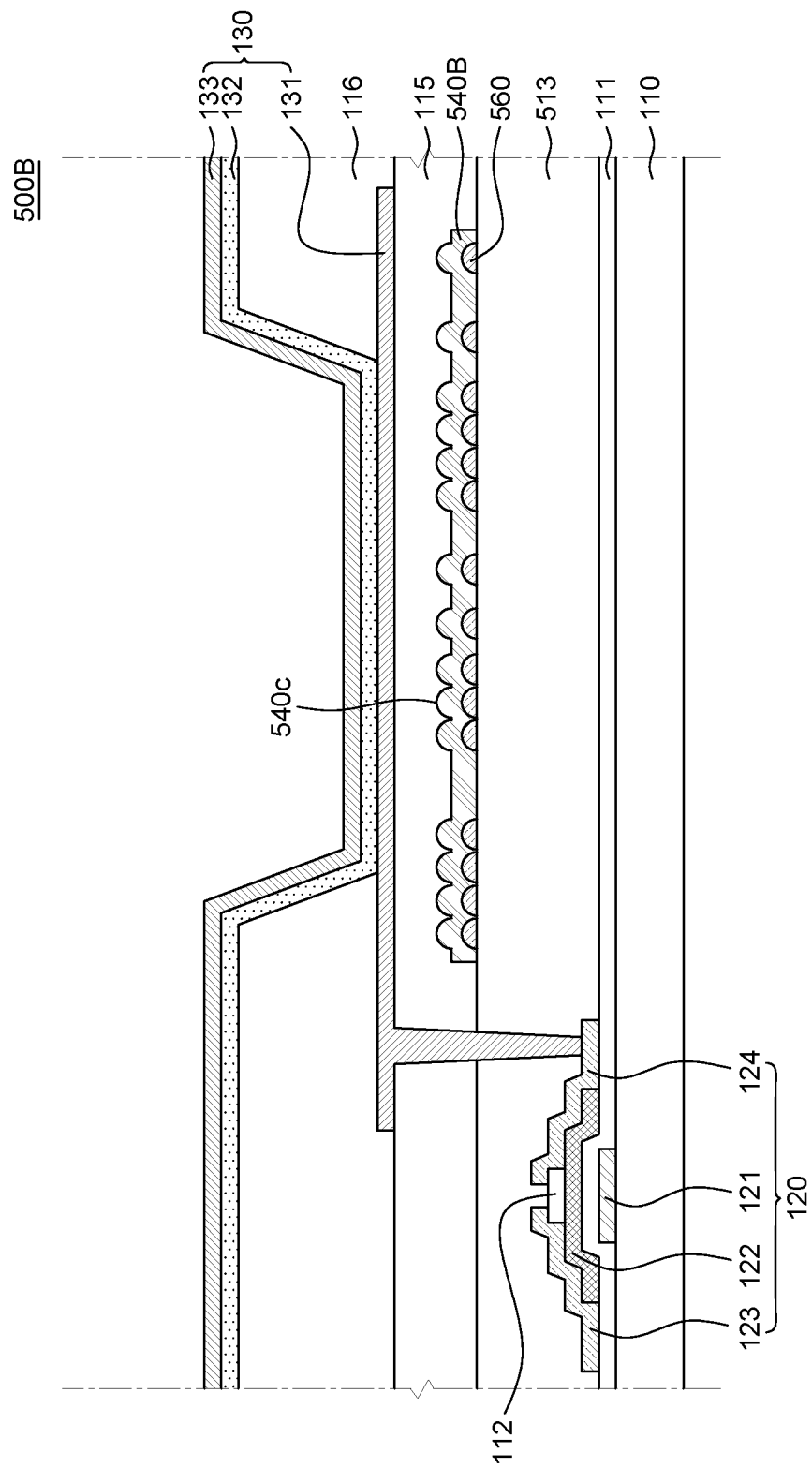
FIG. 5B is a cross-sectional view of a light emitting display apparatus according to another example embodiment of the present disclosure.

FIG. 5A is a cross-sectional view of a light emitting display apparatus according to another example embodiment of the present disclosure. FIG. 5B is a cross-sectional view of a light emitting display apparatus according to another example embodiment of the present disclosure.

As compared with the light emitting display apparatus 400 of FIG. 4, a first planarization layer 513 and a film 550 of a light emitting display apparatus 500A of FIG. 5A are different but other configurations are the same or substantially the same so that a redundant description will be omitted or brief.

Further, as compared with the light emitting display apparatus 500A of FIG. 5A, a plurality of nano structures 560 of a light emitting display apparatus 500B of FIG. 5B are different but other configurations are the same or substantially the same so that a redundant description will be omitted or brief.

First, with reference to the sample of FIG. 5A, the first planarization layer 513 does not include any separate convex or concave portion at its top surface. For example, as illustrated in FIG. 5A, an upper surface of the first planarization layer 513 has a flat surface on which the film 550 is disposed.

The film 550 of the light emitting display apparatus 500A according to this example embodiment of the present disclosure includes a plurality of convex portions 550a which are aperiodically formed (e.g., irregularly or non-uniformly dispersed). For example, a film having a plurality of irregular convex portions can be separately disposed on the upper surface of the first planarization layer 513 having the flat upper surface.

With reference to FIG. 5A, a metal layer 540A is formed along an upper surface of the film 550 including the plurality of convex portions 550a which are aperiodically formed. As a result, a plurality of aperiodic convex portions 540C can be formed on the upper surface of the metal layer 540A, and correspond to the plurality of aperiodic convex portions 550a of the film 550.

Therefore, in the light emitting display apparatus 500A according to this example embodiment of the present disclosure, the film 550 having an uneven upper surface is attached onto the first planarization layer 513 so that curved parts are formed on the first planarization layer 513. Therefore, it is possible to implement the metal layer having an uneven shape without performing a separate mask process. Further, the process is simplified so that the process cost can be reduced and the increase in the process time or tact time can be suppressed or reduced.

Further, when the light emitting display apparatus 500A according to this example embodiment of the present disclosure is implemented as a large-size display apparatus, if a film 550 is separately attached onto the first planarization layer 513, a plurality of films 550 are attached so that a convex structure in the large-size display apparatus can be easily implemented. Therefore, even when the large-size light emitting display apparatus 500A is implemented, the restrictions can be minimized.

Next, with reference to FIG. 5B, a light emitting display apparatus 500B according to another example embodiment of the present disclosure includes a plurality of nano structures 560 disposed on a first planarization layer 513. Further, a metal layer 540B is disposed on the first planarization layer 513 and the plurality of nano structures 560 so as to cover the plurality of nano structures 560.

The plurality of nano structures 560 disposed on the first planarization layer 513 can be disposed in a position corresponding to an area where the light emitting element 130 is located, but is not limited thereto and can be disposed on an entire surface of the first planarization layer 513.

With reference to FIG. 5B, since the metal layer 540B is disposed so as to cover the plurality of nano structures 560 disposed on an upper surface of the first planarization layer 513, the upper surface of the metal layer 540B has an uneven upper surface following the curved/projected shape of the plurality of nano structures 560. For example, the plurality of nano structures 560 can be irregularly or non-uniformly dispersed, so that the metal layer 540B disposed on top of the nano structures 560 also has a plurality of convex portions 540C irregularly/non-uniformly dispersed and corresponding to the shapes and/or locations of the nano structures 560.

Therefore, in the light emitting display apparatus 500B according to another example embodiment of the present disclosure, the plurality of nano structures 560 can be separately disposed in a desired position of the first planarization layer 513. Therefore, the plurality of nano structures 560 can be disposed in a selected area or portion. As a result, when the plurality of nano structures 560 are disposed only in a pixel position, a blurring phenomenon can be suppressed or reduced.

Figure 6:
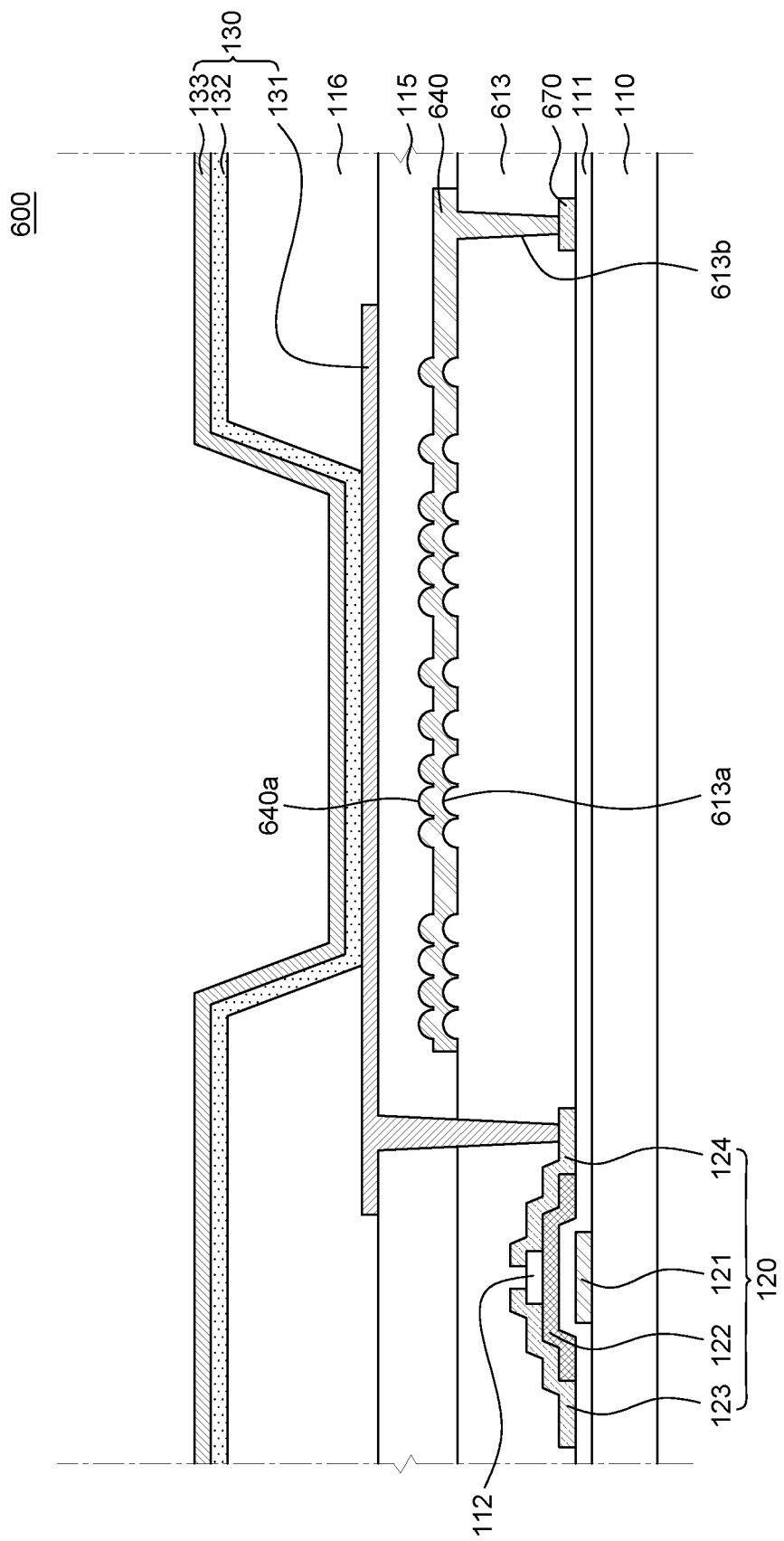
FIG. 6 is a cross-sectional view of a light emitting display apparatus according to another example embodiment of the present disclosure.

FIG. 6 is a cross-sectional view of a light emitting display apparatus according to another example embodiment of the present disclosure. A light emitting display apparatus 600 of FIG. 6 is different from the light emitting display apparatus 400 of FIG. 4 in that a power supply line 670 is added with different configurations of a first planarization layer 613 and a metal layer 640, but other configurations are the same or substantially the same so that a redundant description will be omitted or brief.

With reference to FIG. 6, a gate insulating layer 111 is disposed on a substrate 110, and the power supply line 670 is disposed on the gate insulating layer 111. The power supply line 670 is a wiring line through which the power is supplied to the metal layer 640 so that the power supply line 670 can be electrically connected to the metal layer 640 through a contact hole 613b formed in a first planarization layer 613. The first planarization layer 613 further includes a plurality of convex portions 613a which are aperiodically formed, e.g., non-uniformly dispersed. The power supply line 670 is disposed on the same layer as a source electrode 123 and a drain electrode 124 of a thin film transistor 120 and can be formed of the same material, but it is not limited thereto. The metal layer 640 can be disposed on a different layer from that of the source electrode 123 and the drain electrode 124 and can be formed of a different material. The metal layer 640 is disposed on the first planarization layer 613 and fills the contact hole 613b, and includes a plurality of convex portions 640a which are aperiodically formed and correspond to the plurality of convex portions 613a of the first planarization layer 613.

The power supply line 670 can be applied with a ground voltage or a constant voltage. For example, when a constant voltage is applied to the power supply line 670, a high potential voltage VDD which is a constant voltage used at the time of driving the light emitting display apparatus 600 can be applied to the power supply line 670.

In the light emitting display apparatus 600 according to this example embodiment of the present disclosure, the metal layer 640 can be grounded or can be applied with a constant voltage through the power supply line 670 to which the ground voltage or the constant voltage is applied. First, when the constant voltage such as a high potential voltage VDD is applied to the power supply line 670, a parasitic capacitance component between the metal layer 640 and other conductive components or layers can be relieved. Further, when the ground voltage is applied to the power supply line 670, a dielectric characteristic between the metal layer 640 and other conductive components or layers can be removed so that the parasitic capacitance component can be minimized or reduced. Therefore, in the light emitting display apparatus 600 according to this example embodiment of the present disclosure, the power supply line 670 to which the ground voltage or the constant voltage is applied is used. Therefore, an erroneous signal flowing through the thin film transistor 120 or increase of a leakage current due to the parasitic capacitance between the metal layer 640 and other conductive components or layers can be minimized or reduced.

Figure 7:
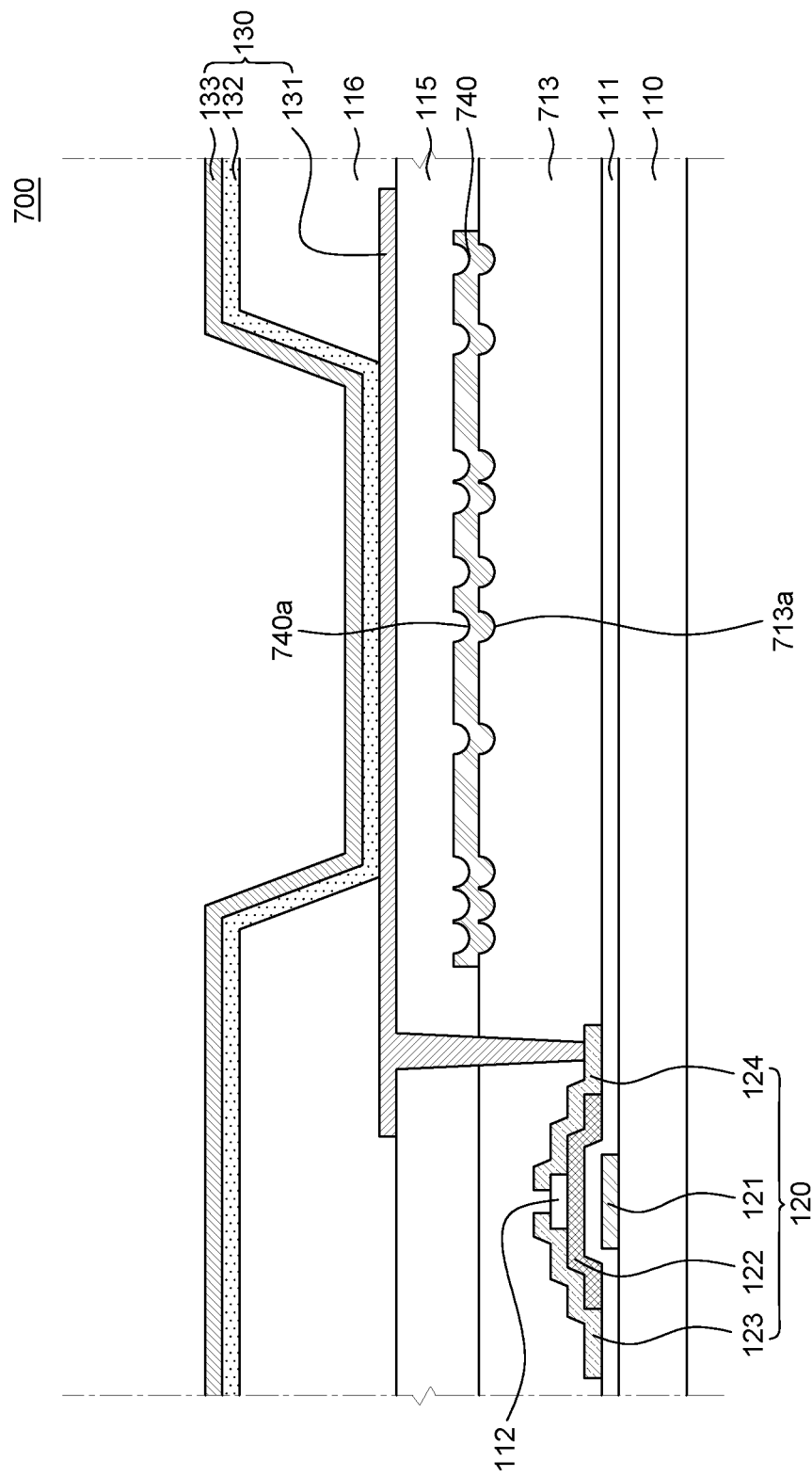
FIG. 7 is a cross-sectional view of a light emitting display apparatus according to another example embodiment of the present disclosure.

FIG. 7 is a cross-sectional view of a light emitting display apparatus according to another example embodiment of the present disclosure. As compared with the light emitting display apparatus 400 of FIG. 4, a shape of a metal layer 740 and a first planarization layer 713 of a light emitting display apparatus 700 of FIG. 7 are different, but other configurations are the same or substantially the same so that a redundant description will be omitted or brief.

Instead of having the convex portions 413a and 440a as in FIG. 4, in the light emitting display apparatus 700 of FIG. 7 the first planarization layer 713 has a plurality of concave portions 713a non-uniformly dispersed at its upper surface, and the metal layer 740 has a plurality of concave portions 740a which are non-uniformly dispersed at its upper surface on the first planarization layer 713. The concave portions 740a correspond to the concave portions 713a.

Figure 8:
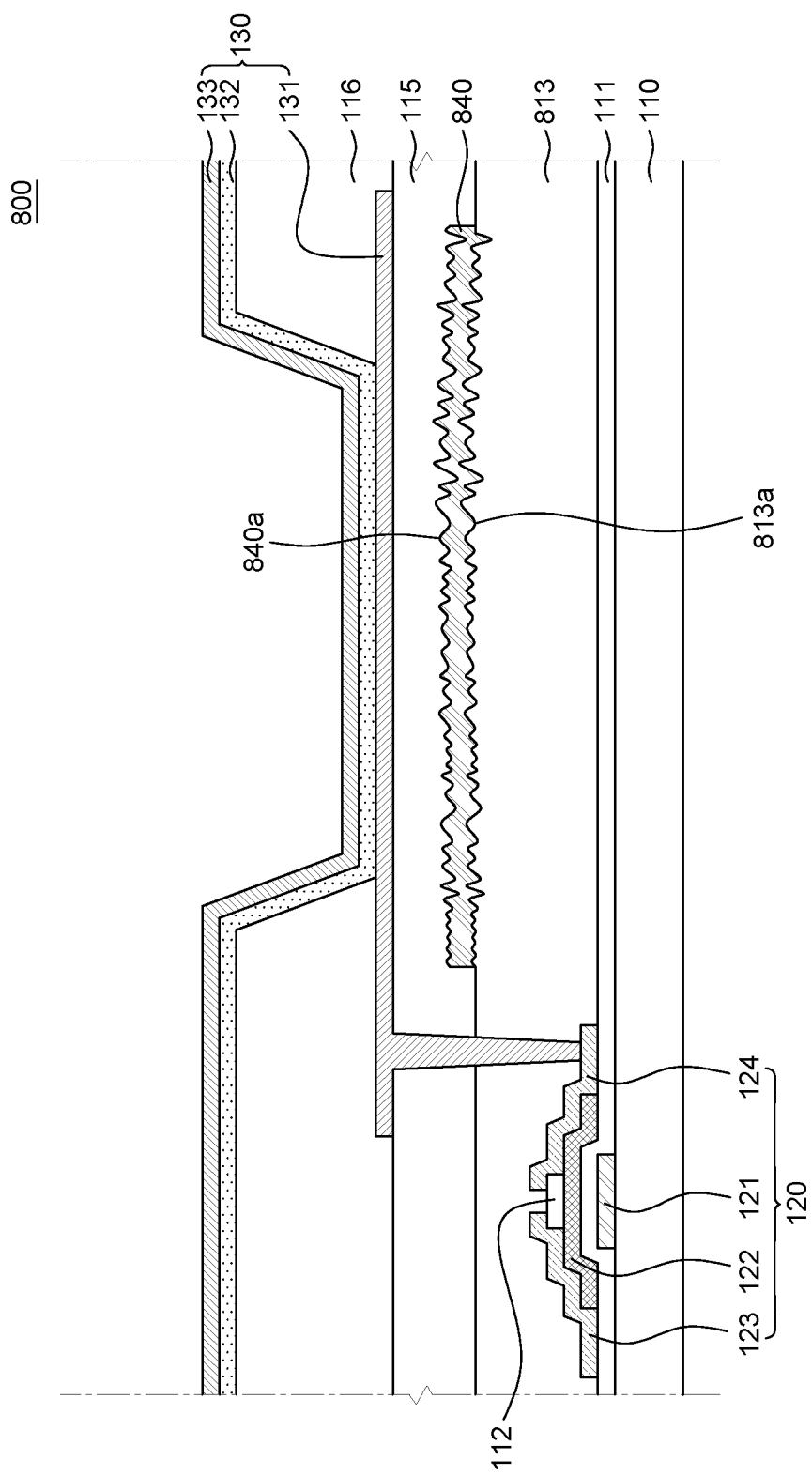
FIG. 8 is a cross-sectional view of a light emitting display apparatus according to another example embodiment of the present disclosure.

FIG. 8 is a cross-sectional view of a light emitting display apparatus according to another example embodiment of the present disclosure. As compared with the light emitting display apparatus 400 of FIG. 4, a shape of a metal layer 840 and a first planarization layer 813 of a light emitting display apparatus 800 of FIG. 8 are different, but other configurations are the same or substantially the same so that a redundant description will be omitted or brief.

With reference to FIG. 8, the first planarization layer 813 has an uneven upper surface on which fine wrinkles 813a are formed. Such a first planarization layer 813 is formed by a process of forming wrinkles in a hardening process during the exposure treatment, a process of forming wrinkles by performing a separate thermal treatment, or a process of removing a tensile stress after forming the first planarization layer 813 in a state when the tensile stress is applied to the substrate 110, but is not limited thereto.

With reference to FIG. 8, the metal layer 840 having fine wrinkles 840a is disposed in an area corresponding to an area where the light emitting element 130 is disposed on the first planarization layer 813, and a second planarization layer 115 is disposed on the first planarization layer 813 so as to cover the metal layer 840.

In the light emitting display apparatus 700 according to this example embodiment of the present disclosure, the metal layer 840 having a plurality of convex/concave portions in which the fine wrinkles 840a are formed is formed in an area where the light emitting element 130 is located or disposed. The fine wrinkles 840a of the metal layer 840 can correspond to the fine wrinkles 813a of the first planarization layer 813, but may not. The fine wrinkles 840a, 813a can be in the shape of indents, protrusions, combination thereof, etc. Therefore, the light extracting efficiency of light emitted from the light emitting element 130 can be increased.

According to the present disclosure, one or more features in any example embodiment can be applied to another example embodiment. Further, in all embodiments, the convex portions in the examples can be concave portions, or a mixture of convex and concave portions, regularly or irregularly dispersed. Furthermore, in all embodiments, the metal layer can server as a reflective layer.

The embodiments of the present disclosure can also be described as follows.

According to an embodiment of the present disclosure, a light emitting display apparatus comprises a substrate, a first planarization layer on the substrate, a metal layer having an uneven surface and disposed on the first planarization layer, a second planarization layer covering the metal layer on the first planarization layer, and a light emitting element on the second planarization layer. The second planarization layer can be disposed between a bottom layer of the light emitting element and the metal layer so as to separate the bottom layer of the light emitting element from the metal layer.

In the display apparatus according to the present disclosure, the uneven surface of the metal layer directly may contact the second planarization layer covering the metal layer.

In the display apparatus according to the present disclosure, the light emitting element may include an anode being the bottom layer and electrically connected, via a contact hole, to a drain electrode of a thin film transistor disposed on the substrate; a light emitting layer disposed on the anode; and a cathode disposed on the light emitting layer.

In the display apparatus according to the present disclosure, the first planarization layer may include a plurality of convex portions and/or a plurality of concave portions at least in an area where the metal layer is disposed. The metal layer may include a plurality of convex portions and/or a plurality of concave portions, which are disposed along an upper surface of the plurality of convex portions and/or the plurality of concave portions of the first planarization layer.

In the display apparatus according to the present disclosure, the plurality of convex portions and/or the plurality of concave portions of at least one of the first planarization layer and the metal layer may be aperiodically disposed.

In the display apparatus according to the present disclosure, the plurality of convex portions and/or the plurality of concave portions of at least one of the first planarization layer and the metal layer may have one of a hemispherical shape, a semi-ellipsoidal shape, and a pyramidal shape.

In the display apparatus according to the present disclosure, a thickness of the second planarization layer may be approximately 0.5 µm to 5 µm.

In the display apparatus according to the present disclosure, the light emitting display apparatus may further comprise a film on the first planarization layer and having an uneven upper surface. The metal layer may be disposed on the uneven upper surface of the film.

In the display apparatus according to the present disclosure, the light emitting display apparatus may further comprise a plurality of nano structures disposed on the first planarization layer. The metal layer may be disposed on the first planarization layer and the plurality of nano structures so as to cover the plurality of nano structures.

In the display apparatus according to the present disclosure, the light emitting element may include an anode, a light emitting layer on the anode, and a cathode on the light emitting layer. The metal layer may be electrically insulated from the anode by the second planarization layer.

In the display apparatus according to the present disclosure, the metal layer may be electrically floated.

In the display apparatus according to the present disclosure, the light emitting display apparatus may further comprise a power supply line configured to be applied with a ground voltage or a constant voltage. The metal layer may be electrically connected to the power supply line via a contact hole in the first planarization layer.

In the display apparatus according to the present disclosure, the first planarization layer may include a plurality of convex portions and/or concave portions dispersed non-uniformly in an area where the metal layer is disposed.

In the display apparatus according to the present disclosure, an upper surface and/or a lower surface of the metal layer may include wrinkles.

In the display apparatus according to the present disclosure, the metal layer may be disposed only in pixel areas of the display apparatus.

In the display apparatus according to the present disclosure, the light emitting element may be evenly formed on the second planarization layer According to an embodiment of the present disclosure, a light emitting display apparatus comprises a substrate, a first planarization layer on the substrate, a light emitting element on the first planarization layer, a reflective layer between the first planarization layer and the light emitting element, the reflective layer having a plurality of convex portions and/or a plurality of concave portions to reflect light emitted from the light emitting element toward the light emitting element, and configured to enhance a light extracting efficiency of the light emitting element, and a second planarization layer, which includes a flat upper surface, covers the reflective layer so as to reduce a scattering reflectance of the reflective layer and the light emitting element and electrically insulates the light emitting element from the reflective layer.

In the display apparatus according to the present disclosure, the light emitting display apparatus may further comprise a power supply line electrically connected to the reflective layer on the substrate. The power supply line may be configured to transmit a ground voltage or a constant voltage to the reflective layer to reduce a parasitic capacitor caused by the reflective layer.

In the display apparatus according to the present disclosure, a thickness of the second planarization layer which covers the reflective layer may be approximately 0.5 µm to 5 µm to ensure electrical stability of the light emitting element.

In the display apparatus according to the present disclosure, the plurality of convex portions and/or the plurality of concave portions of the reflective layer may be aperiodically disposed to reduce interference moiré due to the plurality of convex portions and/or the plurality of concave portions.

In the display apparatus according to the present disclosure, the second planarization layer may contact directly the reflective layer, and insulate the reflective layer from the light emitting element.

In the display apparatus according to the present disclosure, the first planarization layer may include a plurality of convex portions and/or a plurality of concave portions, which are disposed at an upper surface of the first planarization layer and correspond to the plurality of convex portions and/or the plurality of concave portions of the reflective layer.

According to another aspect of the present disclosure, a light emitting display apparatus includes a substrate; a first planarization layer on the substrate; a metal layer on the first planarization layer; a second planarization layer covering the metal layer on the first planarization layer; and a light emitting element on the second planarization layer, wherein the metal layer is formed to conform with (e.g., to correspond to) the second planarization layer to reduce surface plasmon loss of the metal layer, thereby improving light extracting efficiency of the light emitting display apparatus.

In the display apparatus according to the present disclosure, the metal layer and the second planarization layer may conform to each other to have a plurality of convexes and/or concaves (e.g., projections and/or indents).

In the display apparatus according to the present disclosure, distances between the plurality of convexes and/or concaves of the metal layer may vary, and/or distances between the plurality of convexes and/or concaves of the second planarization layer may vary.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display apparatus, comprising:
    a substrate;
    a first planarization layer on the substrate;
    a metal layer having an uneven surface and disposed on the first planarization layer;
    a second planarization layer covering the metal layer on the first planarization layer; and
    a light emitting element on the second planarization layer, wherein the second planarization layer is disposed between a bottom layer of the light emitting element and the metal layer so as to separate the bottom layer of the light emitting element from the metal layer, wherein the light emitting element includes an anode being the bottom layer, a light emitting layer on the anode, and a cathode on the light emitting layer, and wherein the metal layer is electrically insulated from the anode by the second planarization layer.

2. The light emitting display apparatus according to claim 1, wherein the uneven surface of the metal layer directly contacts the second planarization layer covering the metal layer.

3. The light emitting display apparatus according to claim 1, wherein the anode is electrically connected, via a contact hole, to a drain electrode of a thin film transistor disposed on the substrate.

4. The light emitting display apparatus according to claim 1, wherein the first planarization layer includes a plurality of convex portions and/or a plurality of concave portions provided in an area where the metal layer is disposed, and the metal layer includes a plurality of convex portions and/or a plurality of concave portions, which are disposed along an upper surface of the plurality of convex portions and/or the plurality of concave portions of the first planarization layer.

5. The light emitting display apparatus according to claim 4, wherein the plurality of convex portions and/or the plurality of concave portions of at least one of the first planarization layer and the metal layer are aperiodically disposed.

6. The light emitting display apparatus according to claim 4, wherein the plurality of convex portions and/or the plurality of concave portions of at least one of the first planarization layer and the metal layer have one of a hemispherical shape, a semi-ellipsoidal shape, and a pyramidal shape.

7. The light emitting display apparatus according to claim 1, wherein a thickness of the second planarization layer is approximately 0.5 µm to 5 µm.

8. The light emitting display apparatus according to claim 1, further comprising:

a film on the first planarization layer, the film having an uneven upper surface, wherein the metal layer is disposed on the uneven upper surface of the film.

9. The light emitting display apparatus according to claim 1, further comprising:

a plurality of nano structures on the first planarization layer, wherein the metal layer is disposed on the first planarization layer and the plurality of nano structures so as to cover the plurality of nano structures.

10. The light emitting display apparatus according to claim 1, wherein the metal layer is electrically floated.

11. The light emitting display apparatus according to claim 1, further comprising:

a power supply line configured to be applied with a ground voltage or a constant voltage, wherein the metal layer is electrically connected to the power supply line via a contact hole in the first planarization layer.

12. The light emitting display apparatus according to claim 11, wherein the first planarization layer includes a plurality of convex portions or concave portions dispersed non-uniformly in an area where the metal layer is disposed.

13. The light emitting display apparatus according to claim 1, wherein an upper surface and/or a lower surface of the metal layer includes wrinkles.

14. The light emitting display apparatus according to claim 1, wherein the metal layer is disposed only in pixel areas of the light emitting display apparatus.

15. The light emitting display apparatus according to claim 1, wherein the light emitting element is evenly formed on the second planarization layer.

16. A light emitting display apparatus, comprising:

a substrate;

a first planarization layer on the substrate;

a light emitting element on the first planarization layer;

a reflective layer between the first planarization layer and the light emitting element, the reflective layer having a plurality of convex portions and/or a plurality of concave portions to reflect light emitted from the light emitting element toward the light emitting element, and configured to enhance a light extracting efficiency of the light emitting element; and a second planarization layer, which includes a flat upper surface, covers the reflective layer so as to reduce a scattering reflectance of the reflective layer and the light emitting element, and electrically insulates the light emitting element from the reflective layer.

17. The light emitting display apparatus according to claim 16, further comprising:

a power supply line electrically connected to the reflective layer on the substrate, wherein the power supply line is configured to transmit a ground voltage or a constant voltage to the reflective layer to reduce a parasitic capacitor caused by the reflective layer.

18. The light emitting display apparatus according to claim 16, wherein a thickness of the second planarization layer which covers the reflective layer is approximately 0.5 µm to 5 µm to ensure electrical stability of the light emitting element.

19. The light emitting display apparatus according to claim 16, wherein the plurality of convex portions and/or the plurality of concave portions of the reflective layer are aperiodically disposed to reduce interference moiré due to the plurality of convex portions and/or the plurality of concave portions.

20. The light emitting display apparatus according to claim 16, wherein the second planarization layer directly contacts the reflective layer, and insulates the reflective layer from the light emitting element.

21. The light emitting display apparatus according to claim 16, wherein the first planarization layer includes a plurality of convex portions and/or a plurality of concave portions, which are disposed at an upper surface of the first planarization layer and correspond to the plurality of convex portions and/or the plurality of concave portions of the reflective layer.

22. A light emitting display apparatus, comprising:

a substrate;

a first planarization layer on the substrate;

a metal layer on the first planarization layer;

second planarization layer covering the metal layer on the first planarization layer; and a light emitting element on the second planarization layer, wherein the metal layer is formed to conform with the second planarization layer to reduce surface plasmon loss of the metal layer, thereby improving light extracting efficiency of the light emitting display apparatus.

23. The light emitting display apparatus according to claim 22, wherein the metal layer and the second planarization layer conform to each other to have a plurality of convexes and/or concaves.

24. The light emitting display apparatus according to claim 23, wherein distances between the plurality of convexes and/or concaves of the metal layer vary, and/or distances between the plurality of convexes and/or concaves of the second planarization layer vary.

\* \* \* \* \*